US010720210B2

(12) United States Patent
Conte

(10) Patent No.: US 10,720,210 B2
(45) Date of Patent: *Jul. 21, 2020

(54) PHASE-CHANGE MEMORY WITH SELECTORS IN BJT TECHNOLOGY AND DIFFERENTIAL-READING METHOD THEREOF

(71) Applicant: STMicroelectronics S.r.l., Agrate Brianza (MB) (IT)

(72) Inventor: Antonino Conte, Tremestieri Etneo (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 16/717,652

(22) Filed: Dec. 17, 2019

(65) Prior Publication Data

US 2020/0126616 A1    Apr. 23, 2020

Related U.S. Application Data

(63) Continuation of application No. 16/133,097, filed on Sep. 17, 2018.

(30) Foreign Application Priority Data

Sep. 28, 2017    (IT) .................. 102017000108905

(51) Int. Cl.
*G11C 7/06* (2006.01)
*G11C 7/08* (2006.01)
(Continued)

(52) U.S. Cl.
CPC ............ *G11C 13/004* (2013.01); *G11C 5/147* (2013.01); *G11C 7/062* (2013.01); *G11C 7/065* (2013.01);
(Continued)

(58) Field of Classification Search
CPC .............. G11C 13/0004; G11C 13/004; G11C 13/0069; G11C 13/0028; G11C 5/147;
(Continued)

(56) References Cited

U.S. PATENT DOCUMENTS 7,633,100 B2    12/2009    Cho et al.
8,830,724 B2    9/2014    Chang
(Continued)

*Primary Examiner* — Hien N Nguyen
(74) *Attorney, Agent, or Firm* — Slater Matsil, LLP

(57) ABSTRACT

A phase-change memory device includes a memory array including a first memory cell and a second memory cell, each comprising a phase-change element and a selector, connected respectively to a first local bitline and a second local bitline, which are in turn connected, respectively, to a first main bitline and a second main bitline. The parasitic capacitance of the main bitlines is precharged at a supply voltage. When the local bitlines are selected to access a respective logic datum stored in the phase-change element, the parasitic capacitance of the local bitlines is first charged using the charge previously stored in the parasitic capacitance of the main bitlines and then discharged through the respective phase-change elements. Reading of the logic datum is made by comparing the discharge times.

20 Claims, 5 Drawing Sheets

(51) Int. Cl.
   *G11C 13/00*    (2006.01)
   *G11C 5/14*     (2006.01)
   *G11C 7/12*     (2006.01)
   *G11C 7/18*     (2006.01)
   *H01L 45/00*    (2006.01)

(52) U.S. Cl.
   CPC .................. *G11C 7/12* (2013.01); *G11C 7/18* (2013.01); *G11C 13/0004* (2013.01); *G11C 13/0026* (2013.01); *G11C 13/0028* (2013.01); *G11C 2013/0042* (2013.01); *G11C 2013/0054* (2013.01); *G11C 2213/79* (2013.01); *H01L 45/06* (2013.01)

(58) Field of Classification Search
   CPC ... G11C 2213/79; G11C 8/08; G11C 16/3427; G11C 13/003; G11C 16/08; G11C 2213/72
   See application file for complete search history.

(56) References Cited

U.S. PATENT DOCUMENTS

| | | |
|---|---|---|
| 9,646,684 B1 | 5/2017 | Calvetti et al. |
| 2006/0083064 A1 | 4/2006 | Edahiro et al. |
| 2010/0195415 A1 | 8/2010 | Seko |
| 2011/0058435 A1 | 3/2011 | Kim |
| 2012/0026777 A1 | 2/2012 | Kitagawa et al. |
| 2014/0078822 A1 | 3/2014 | Di Vincenzo et al. |
| 2015/0070971 A1 | 3/2015 | Katayama et al. |
| 2019/0096480 A1* | 3/2019 | Conte ............... G11C 7/12 |

* cited by examiner

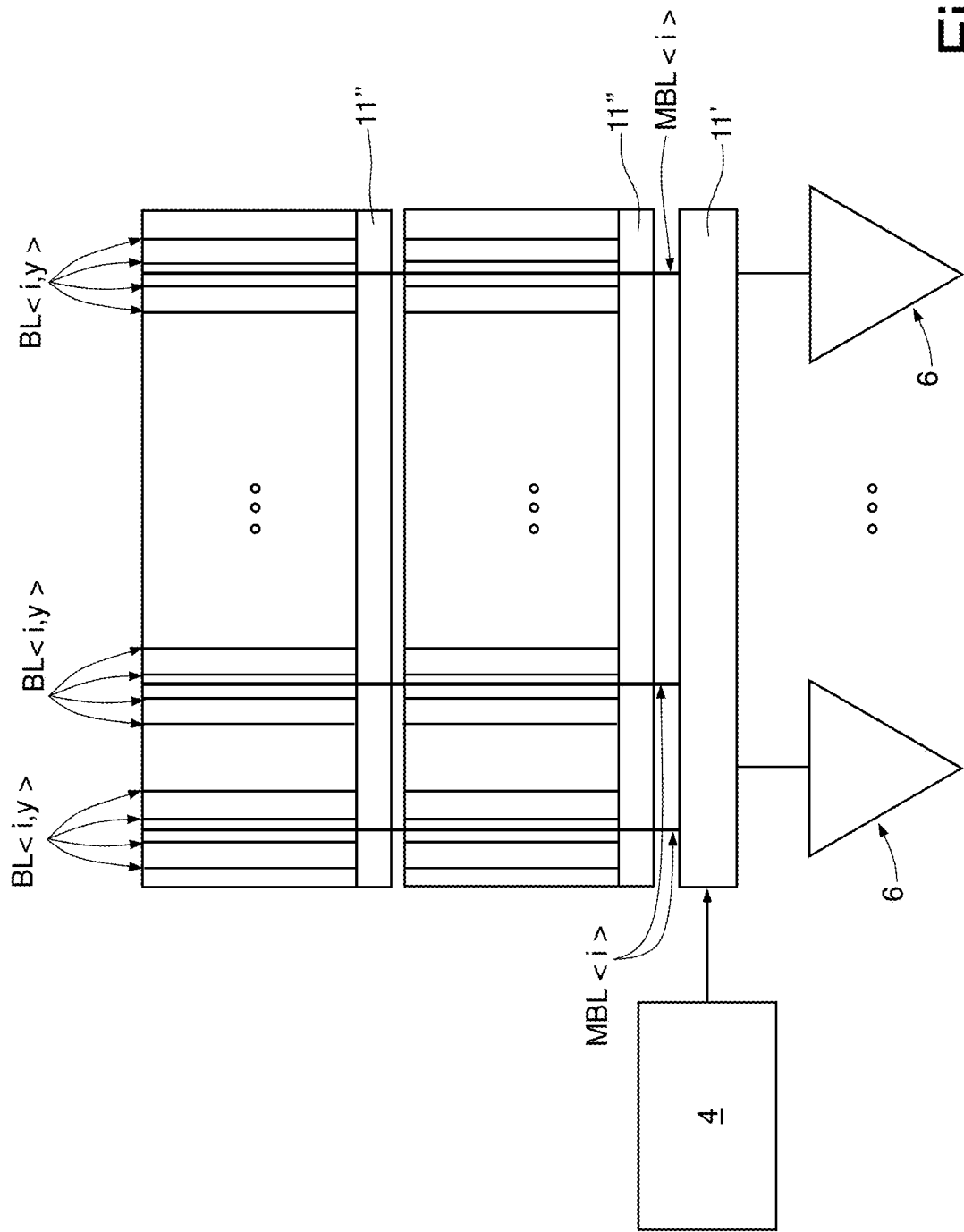

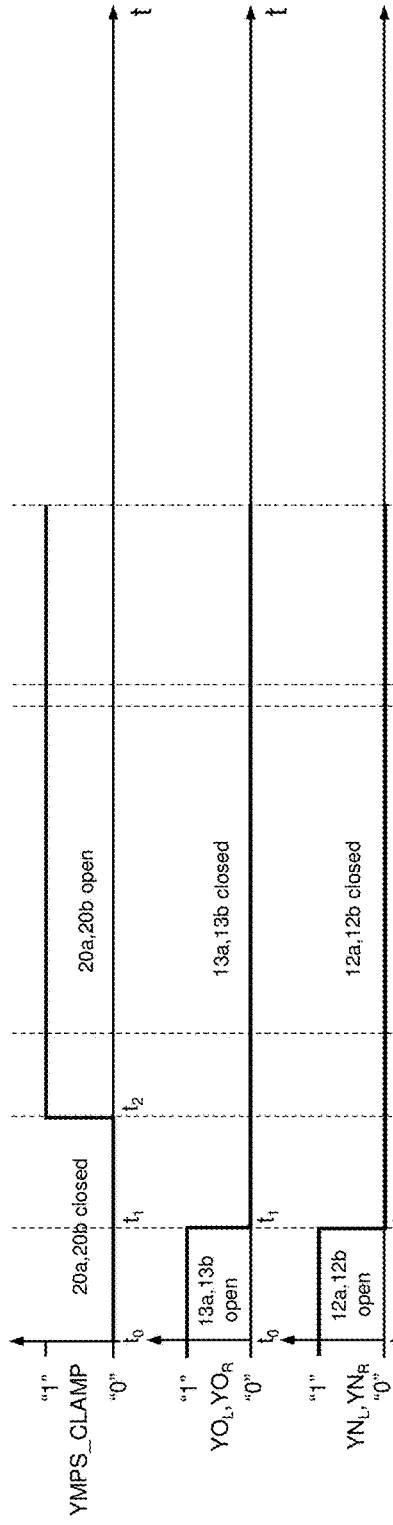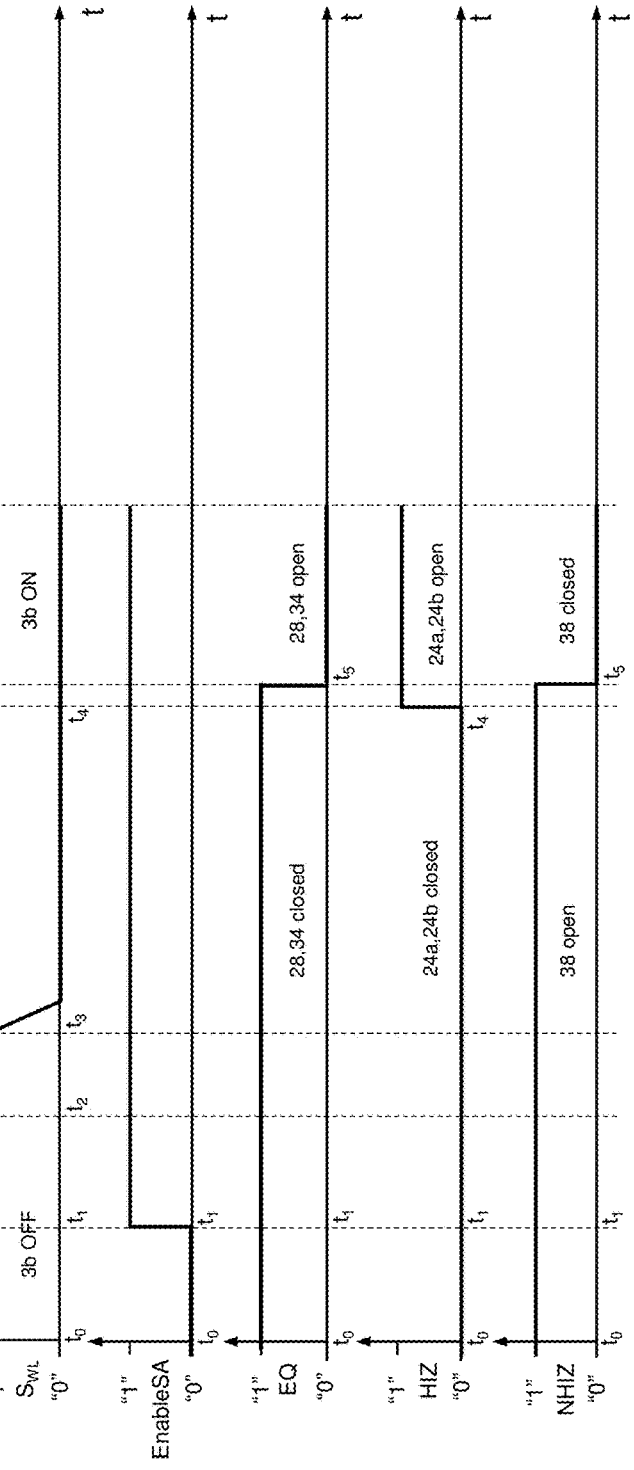

PHASE-CHANGE MEMORY WITH SELECTORS IN BJT TECHNOLOGY AND DIFFERENTIAL-READING METHOD THEREOF

CROSS-REFERENCE TO RELATED APPLICATIONS

This application is a continuation of U.S. patent application Ser. No. 16/133,097, filed Sep. 17, 2018 which claims priority to Italian Patent Application No. 102017000108905, filed on Sep. 28, 2017, which applications are hereby incorporated herein by reference.

TECHNICAL FIELD

The present disclosure relates to a phase-change memory device and to the differential-reading method.

BACKGROUND

As is known, nonvolatile phase-change memories, namely the so-called embedded phase-change memories (ePCMs), represent new-generation integrated memories, in which storage of information is obtained by exploiting phase-change materials, which have the property of being able to switch between phases that have resistivities of considerably different value. In particular, these materials may switch between an amorphous phase, with high resistivity, and a crystalline or polycrystalline phase, with low resistivity. Consequently, in a phase-change memory cell it is possible to associate a different value of a datum stored in the cell to a respective phase of a memory element of the cell. For example, it is possible to use elements of group VI of the periodic table, such as tellurium (Te), selenium (Se), or antimony (Sb), referred to as "chalcogenides" or "chalcogenic materials", to form phase-change memory elements. In particular, an alloy made up of germanium (Ge), antimony (Sb) and tellurium (Te), known as GST (having chemical composition Ge2Sb2Te5) currently finds wide use in such memory elements.

Phase switching in a memory element may be obtained by locally increasing the temperature of the region of chalcogenic material, for example by causing passage of an electric programming current through resistive electrodes (generally known as "heaters") arranged in contact with the region of chalcogenic material. The electric current, by the Joule effect, generates the temperature profile necessary for phase change. In particular, when the chalcogenic material is in the amorphous state, with high resistivity (the so-called RESET state), it is necessary to apply a first current pulse (the so-called SET pulse) of a duration and amplitude such as to enable the chalcogenic material to cool slowly. Subjected to this treatment, the chalcogenic material changes state and switches from the high-resistivity state to a low-resistivity crystalline state (the so-called SET state). Conversely, when the chalcogenic material is in the SET state, it is necessary to apply a second current pulse (the so-called RESET pulse) of large amplitude and short duration so as to cause the chalcogenic material to return into the high-resistivity amorphous state.

As is known, a number of memory cells may be arranged in a memory array in rows formed by wordlines (WL) and columns formed by bitlines (BL).

Selectors, for example MOSFETs or BJTs, are electrically connected to the heaters so as to enable selective passage of the electric programming current through a respective memory element of a specific memory cell. Undesired programming of non-selected memory cells is thus prevented.

Use of selectors of a BJT type affords advantages over the MOSFET technology, such as a considerable reduction of the area occupied by the cells. However, generally, the use of BJT selectors causes a higher power consumption and the need to use a higher supply voltage on account of the high threshold voltage of the BJT and of the current passing through the base terminal of the BJT.

In ePCM circuits of a known type, reading of the datum stored in a memory cell may be carried out by applying to the memory element of chalcogenic material a voltage sufficiently low as not to cause a sensible heating thereof, and then by reading the value of the current that flows in the memory cell. Given that the current is proportional to the conductivity of the chalcogenic material, it is possible to determine in which phase the material is, and thus arrive at the datum stored in the memory cell. Further known is an ePCM-reading architecture of a differential type, in which two memory cells of opposite state are associated to each bit. For example, a bit has a value "1" if a first memory cell and a second memory cell associated to the bit are, respectively, in the SET state and in the RESET state, and has a value "0" if the first and second memory cells are, respectively, in the RESET state and in the SET state.

Differential-reading architectures for ePCMs afford advantages in terms of reliability, in so far as the datum is stored in a redundant way and further does not require generation of a reference current in so far as reading is carried out simply by comparing the respective currents that flow in the cells associated to a same bit.

Comparison of the currents in memory cells of a differential type is carried out using a sense amplifier, which may be selectively connected to the bitline associated to the memory cells. In this case, also the sense amplifier has a differential structure, and it is necessary to minimize the offset between elements of the amplifier to improve the accuracy of the reading operation.

In general, in reading architectures for nonvolatile memories of a known type, it is necessary for the sense amplifier to be able to operate at a supply voltage higher than the biasing voltage of the bitlines. In the case of memories with selector of a BJT type, for example, a reading architecture of a known type would render necessary supply of the sense amplifiers at a voltage higher than 1.8 V (on account of process corners and temperature), whereas the supply voltage available on the device tends to be considerably lower, for example between 1 V and 1.3 V in 40-nm technological processes, and between 0.9 V and 1.1 V in 28-nm technological processes. For this reason, the sense amplifiers would have to be supplied at a boosted voltage using charge pumps, thus increasing power consumption thereof. For example, using a one-stage charge pump, power consumption of the sense amplifier is multiplied by a factor greater than 2.

SUMMARY

Embodiments of the present invention provide a phase-change memory device and a differential-reading method that can overcome the drawbacks of the known art.

According to the present invention, a phase-change memory device and a differential-reading method are provided. For example, A phase-change memory device, comprises a memory array including a first local bitline connected to a first memory cell, which comprises a first selector in BJT technology arranged in series with a first phase-change element having a first value of resistance which may be associated to a first logic datum, and a second local bitline connected to a second memory cell, which comprises a second selector in BJT technology arranged in series with a second phase-change element having a second value of resistance, different from the first value of resistance, which may be associated to a second logic datum. The first and second local bitlines have a respective first parasitic capacitance and second parasitic capacitance. The memory array also includes a first main bitline having a third parasitic capacitance and a second main bitline, having a fourth parasitic capacitance.

A first precharging switch is disposed between the first main bitline and a supply line, designed to supply a first supply voltage and a second precharging switch is disposed between the second main bitline and the supply line. A first local switch is disposed between the first local bitline and the first main bitline and a second local switch is disposed between the second local bitline and the second main bitline. A controller is operatively coupled to respective control terminals of the first and second precharging switches and of the first and second local switches.

The controller is configured to close at a first instant the first and second precharging switches for charging the third and fourth parasitic capacitances at the first supply voltage, at a second instant temporally subsequent to the first instant, to open the first and second precharging switches and close the first and second local switches, for charging the first and second parasitic capacitances using the voltage of the third and fourth parasitic capacitances; and, at a third instant temporally subsequent to the second instant, to activate the first selector in order to enable a discharge of the first and third parasitic capacitances through the first memory cell at a first discharging rate that is a function of the first value of resistance, and to activate the second selector to enable a discharge of the second and fourth parasitic capacitances through the second memory cell at a second discharge rate that is a function of the second value of resistance.

A reading stage can read the logic datum contained in the first and second memory cells, which is coupled to the memory array and is configured to compare with one another the first and second discharge rates and generate a result of the comparison.

BRIEF DESCRIPTION OF THE DRAWINGS

For a better understanding of the present invention, preferred embodiments thereof are now described, purely by way of non-limiting example, with reference to the attached drawings, wherein:

FIG. 1B is a schematic illustration of another portion of the nonvolatile memory device of FIG. 1A, comprising the portion represented in FIG. 1A;

FIGS. 3A-3H show the time plots of respective control signals of the nonvolatile memory device of FIG. 1A during a cycle of reading of the logic data.

DETAILED DESCRIPTION OF ILLUSTRATIVE EMBODIMENTS

Figure 1A:
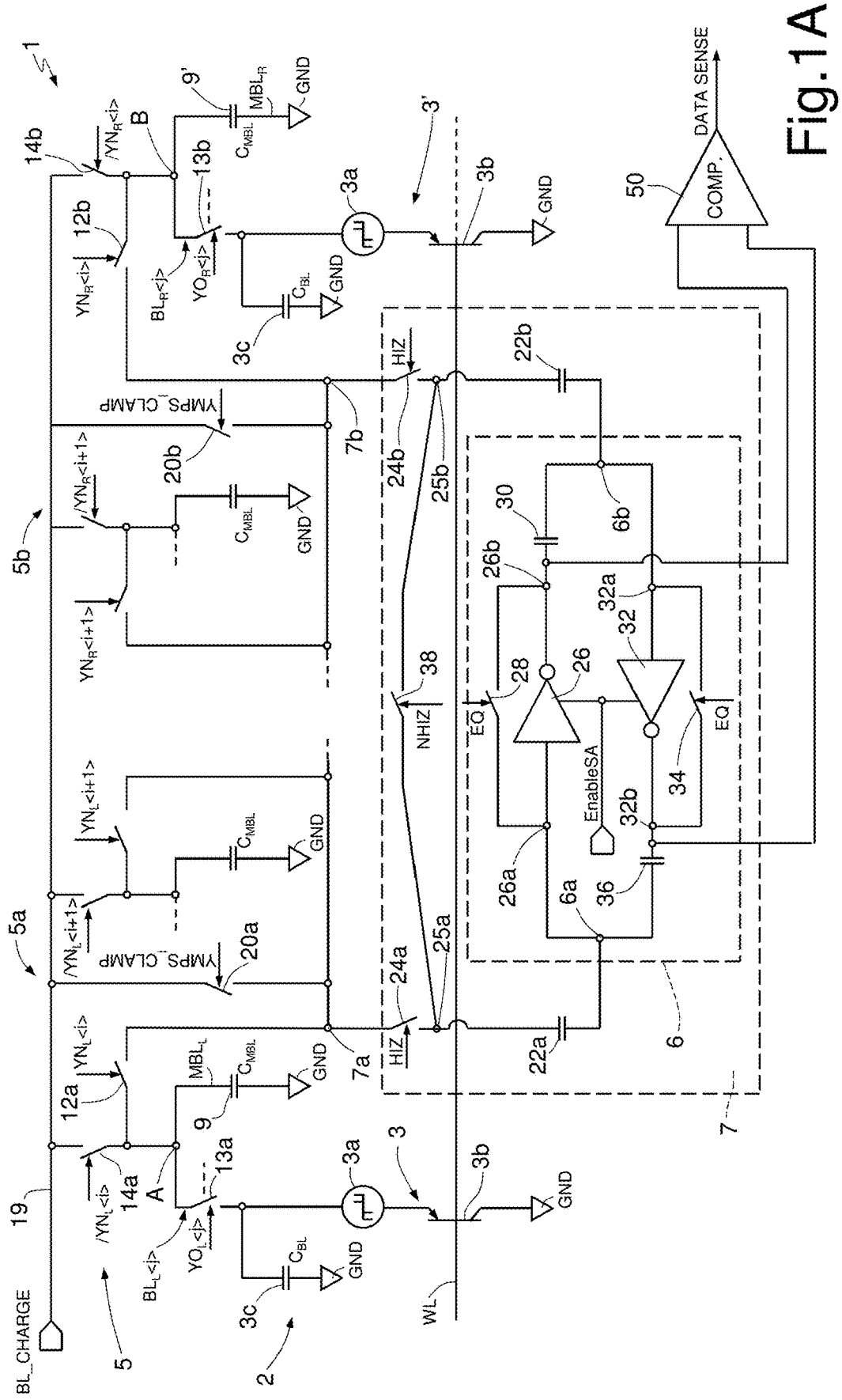
FIG. 1A is a schematic illustration of a portion of a nonvolatile memory device according to one embodiment of the present invention.

Represented schematically in FIG. 1A and designated as a whole by the reference number 1 is a portion of a nonvolatile memory device, in particular of an ePCM type, limitedly to just the parts necessary for an understanding of the present disclosure.

In particular, the nonvolatile memory device 1 comprises a memory array 2, constituted by a plurality of first memory cells 3, and by a plurality of second memory cells 3', which may be selected by local wordlines WL and local bitlines BL. In a per se known manner, the first memory cells 3 store a logic datum of a binary type. The second memory cells 3' correspond, in number and manufacturing characteristics, to the first memory cells 3, and store a logic datum complementary to the logic datum stored in the respective first memory cells 3. The first and second memory cells 3, 3' are queried simultaneously in order to carry out a differential-reading of the logic data.

In a way not shown in the figure, a plurality of first memory cells 3 may be present, operatively coupled to respective local wordlines WL and to respective local bitlines $BL_L$, for example in a number equal to four or multiples of four. Likewise, a respective plurality of memory cells 3' is present, operatively coupled to the local wordlines WL and to respective local bitlines $BL_R$.

The first and second memory cells 3, 3' are identical to one another and comprise a phase-change element 3a, a selector element 3b, operatively coupled thereto, and a bit-line capacitor 3c, which represents the parasitic capacitance of the respective local bitline BL. The phase-change element 3a includes a phase-change material (for example, a chalcogenide) and is thus able to store data in the form of levels of resistance associated to the different phases assumed by the phase-change material. The selector element 3b, in the embodiment illustrated, is a BJT having its control terminal (base) connected to the respective wordline WL, a first conduction terminal (emitter) connected to the phase-change element 3a, and a second conduction terminal (collector) connected to a reference potential, for example to a ground plane GND. The selector element 3b is controlled so as to enable, when selected (i.e., switched on by the signal of the respective local wordline WL to which it is coupled), passage of a reading current through the phase-change element 3a, during an operation of reading of the logic datum stored therein, as described more fully hereinafter. The bit-line capacitor 3c is connected in parallel to the series of the phase-change element 3a and the selector element 3b.

The nonvolatile memory device 1 further comprises a row decoder (not illustrated), designed to select the local wordline WL corresponding to the memory cell 3, 3' each time to be addressed, and a column decoder 5, designed to select the local bitline BL of the memory cell 3, 3' to be addressed. Given the array structure, activation of a local wordline WL and of a local bitline BL enables unique selection of one and only one memory cell 3, 3'. The column decoder 5 is arranged between the memory array 2 and a reading stage 7 provided with a sense amplifier 6.

In particular, in use, the column decoder 5 receives at input first local-column-decoding signals $YO_L<j>$ to select a respective local bitline $BL_L<j>$, where j ranges from 0 to 3 in the embodiment described herein, in order to access the respective first memory cell 3, and second local-column-decoding signals $YO_R<j>$ to select a respective local bitline $BL_R<j>$ in order to access the respective second memory cell 3'.

In greater detail, the column decoder 5 is configured to enable in part a current path between a selected bitline $BL_L<j>$ and a first input 7a of the reading stage 7, by closing a local-selection switch 13a arranged between a node A common to all the local bitlines $BL_L<j>$ and the first memory cell 3, and so as to enable in part a current path between a selected bitline $BL_R<j>$ and a second input 7b of the reading stage 7, by closing a local-selection switch 13b arranged between a node B common to all the local bitlines $BL_R<j>$ and the second memory cell 3'. In particular, the local-column-decoding signals $YO_L<j>$, $YO_R<j>$ control, respectively, the local-selection switches 13a and 13b.

A first main bitline $MBL_L$ extends between the node A and the ground plane, thus forming a main-bitline capacitor 9 having capacitance $C_{MBL}$, for example comprised between 30 fF and 120 fF. The node A is coupled to the first input 7a of the reading stage 7 by interposition of a main-selection switch 12a. The node A is further coupled to a charging line 19 by interposition of a precharging switch 14a. As illustrated more fully hereinafter, during a step of the operation of reading of the memory cell 3, the precharging switch 14a is controlled in order to precharge the main-bitline capacitor 9 at the voltage value of the charging line 19, for example chosen between 1.5 V and 1.8 V. A main-column-decoding signal $YN_L<i>$ is supplied at input to the column decoder 5 in order to control the main-selection switch 12a.

A second main bitline $MBL_R$ extends between the node B common to all the local bitlines $BL_L<j>$ and the ground plane GND, to form a main-bitline capacitor 9' having capacitance $C_{MBL}$, for example comprised between 30 fF and 120 fF. For instance, the first and second main bitlines $MBL_L$, $MBL_R$ have the same value of capacitance $C_{MBL}$, in an embodiment in which they have the same dimensions and are arranged symmetrically with respect to the sense amplifier 6. The node B is coupled to the second input 7b of the reading stage 7 by interposition of a main-selection switch 12b. The node B is further coupled to the charging line 19 by interposition of a precharging switch 14b. As illustrated more fully hereinafter, during a step of the operation of reading of the second memory cell 3', the precharging switch 14b is controlled in order to precharge the main-bitline capacitor 9' at the voltage value of the charging line 19. A main-column-decoding signal $YN_R<i>$ is supplied at input to the column decoder 5 in order to control the main-selection switch 12b.

According to one aspect of the present disclosure, the column decoder 5 thus comprises two distinct reading decoding circuits, and in particular a first reading decoding block 5a and a second reading decoding block 5b, designed to generate a respective current path between a first memory cell 3 selected and the first input 7a of the reading stage 7 and, respectively, between a second memory cell 3' selected and the second input 7b of the reading stage 7. The current paths thus generated are completely distinct and separate from one another.

It is evident that the first reading decoding block 5a may comprise a plurality of main bitlines, each of which is electrically coupled to a plurality of local bitlines and respective memory cells, in a way similar to what has been described previously. Further, each main bitline of the plurality of main bitlines of the first reading decoding block 5a is coupled to the charging line 19 and to the first input 7a of the reading stage 7, in a way similar to what has been described previously with reference to the main bitline 9, as shown in FIG. 1A.

It is further evident that also the second reading decoding block 5b may comprise a plurality of main bitlines, each of which is electrically coupled to a plurality of local bitlines and respective memory cells, in a way similar to what has been described previously. Further, each main bitline of the plurality of main bitlines of the second reading decoding block 5b is coupled to the charging line 19 and to the second input 7b of the reading stage 7, in a way similar to what has been described previously with reference to the main bitline 9', as shown in FIG. 1A.

The first reading decoding block 5a and the second reading decoding block 5b have a specular circuit structure. The number of main bitlines belonging to the column decoder 5 depends upon the size of the memory array 2 and/or of the tiles of the memory array 2 and upon the hierarchical organization between main bitlines and local bitlines.

Figure 2:
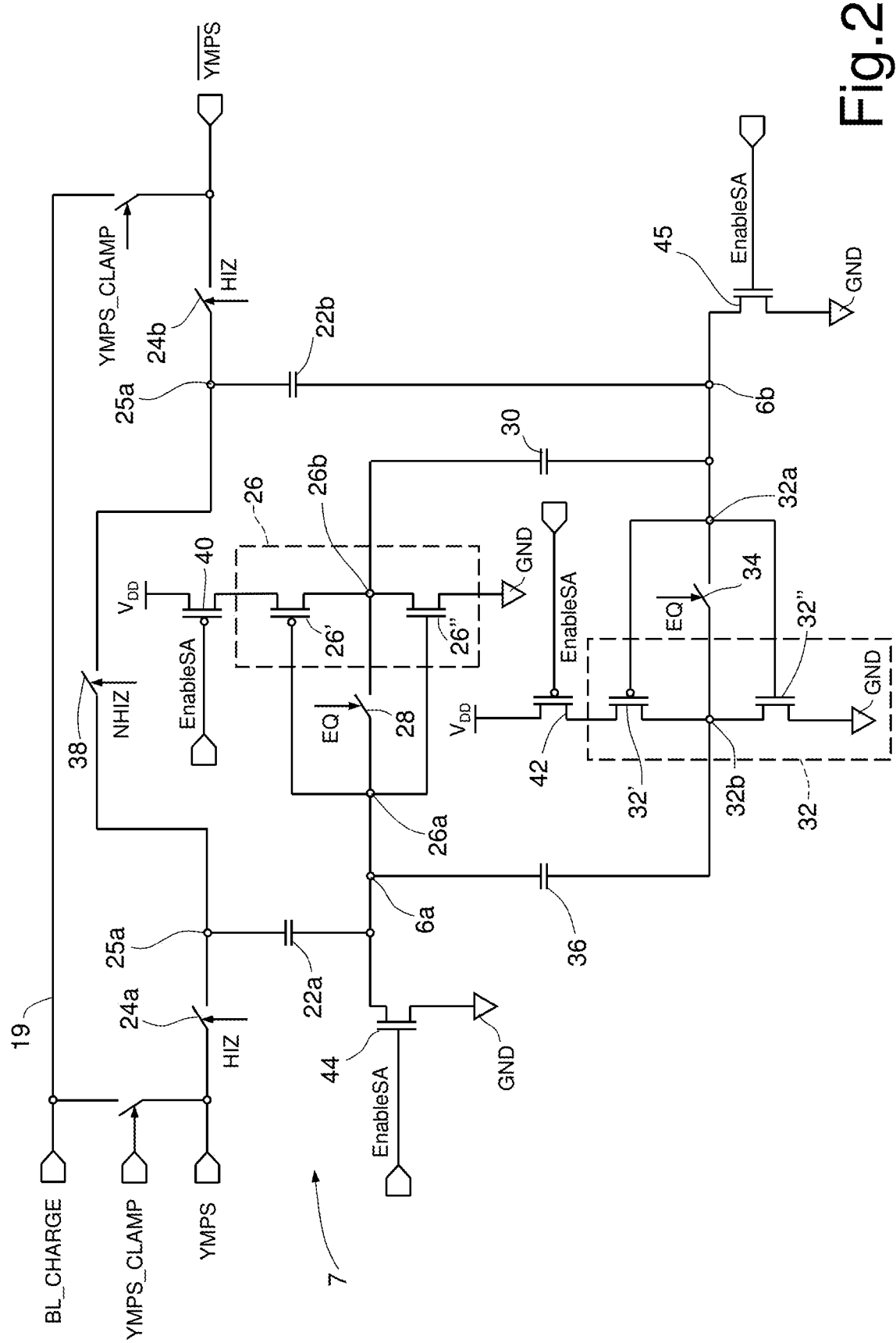
FIG. 2 shows a reading stage, belonging to the nonvolatile memory device of FIG. 1A, for reading logic data stored in memory cells of the memory device itself.

For example, FIG. 1B represents schematically a more extensive portion of the memory device 1, in particular a portion including a first tile 2' and a second tile 2" of the memory array 2. The memory array 2 may comprise a number of tiles. In FIG. 2, the tiles 2', 2" of the memory array 2 are represented limitedly to an example of hierarchical organization between the respective main bitlines and local bitlines. In another embodiment, the hierarchical organization could be different. With joint reference to FIGS. 1A and 1B, a plurality of main bitlines MBL<i> extends through the tiles 2', 2" of the memory array 2 and is connected to a main column decoder 11' including main-selection switches, which are driven by respective main-column-decoding signals (see, for example, the switch 14a and the signal $/YN_L<i>$ of FIG. 1A). The main column decoder 11' enables activation of an electrical path between a main bitline MBL<i> and a sense amplifier 6 by activation of a respective main-selection switch.

In addition, in each tile 2', 2", each main bitline MBL<i> is connected to a plurality of respective local bitlines BL<i, j>. Each memory cell associated to a local bitline BL<i,j> is addressed by a local column decoder 11", including local-selection switches, driven by respective local-column-decoding signals (see, for example, the switch 13a and the signal $YO_L<j>$ of FIG. 1A).

The memory device 1 further comprises a charge pump 4, connected to the main column decoder 11'. As described more fully hereinafter, in use and in an idle state of the memory device 1, the main bitlines MBL<i> are supplied by a positive voltage, for example comprised between 1.5 V and 1.8 V, supplied by the charge pump 4. The main bitlines MBL<i> constitute a natural filter capacitance for the charge pump 4 itself, enabling supply of a peak current necessary for charging the local bitlines BL (as described hereinafter) limiting the voltage drop to a few millivolts. Consequently, the charge pump 4 does not require inside it a dedicated filter capacitance, and its area is consequently minimized.

With reference to FIG. 1A, the selection switches 12a, 12b, 13a, 13b are implemented by MOS transistors, which have a control terminal (gate) that receives the respective column-decoding signal $YN_L<i>$, $YN_R<i>$, $YO_L<j>$, $YO_R<j>$, which is a logic signal having a voltage value in the interval between 0 V and the voltage value of the charging line 19.

Further, the charging line 19 may be electrically connected to the first and second inputs 7a, 7b of the reading stage 7 via respective voltage-clamp switches 20a, 20b, which may be controlled via a voltage-clamp signal YMP-S_CLAMP.

The sense amplifier 6 comprises a first input 6a electrically coupled to the first input 7a of the reading stage 7 via the series of a first coupling capacitor 22a, having two conduction terminals, and a first coupling switch 24a, which also has two conduction terminals. In particular, one terminal of the first coupling capacitor 22a coincides with the first input 6a of the sense amplifier 6, whereas one terminal of the first coupling switch 24a coincides with the first input 7a of the reading stage 7. Further, the other terminal of the first coupling capacitor 22a is connected to the other terminal of the first coupling switch 24a at a common node 25a.

The sense amplifier 6 comprises a second input 6b electrically coupled to the second input 7b of the reading stage 7 via the series of a second coupling capacitor 22b, having two conduction terminals, and a second coupling switch 24b, which also has two conduction terminals. In particular, one terminal of the second coupling capacitor 22b coincides with the second input 6b of the sense amplifier 6, whereas one terminal of the second coupling switch 24b coincides with the second input 7b of the reading stage 7. Further, the other terminal of the second coupling capacitor 22b is connected to the other terminal of the second coupling switch 24b at a common node 25b.

The sense amplifier 6 further comprises a first inverter 26 having an input terminal 26a and an output terminal 26b and a first equilibrium switch 28, connected between the input terminal 26a and the output terminal 26b of the first inverter 26. A first compensation capacitor 30 is connected between the output terminal 26b of the first inverter 26 and the second input 6b of the sense amplifier 6.

The sense amplifier 6 further comprises a second inverter 32 having an input terminal 32a and an output terminal 32b and a second equilibrium switch 34, connected between the input terminal 32a and the output terminal 32b of the second inverter 32. A second compensation capacitor 36 is connected between the output terminal 32b of the first inverter 32 and the first input 6a of the sense amplifier 6.

The reading stage 7 further comprises a reading switch 38, connected between the nodes 25a, 25b.

FIG. 2 shows the reading stage 7 in greater detail as compared to FIG. 1A. Elements that are in common are designated by the same reference numbers and are not described any further. With joint reference to FIGS. 1A and 2, the reading stage 7 comprises a control switch 40 for the first inverter 26 and a control switch 42 for the second inverter 32. The control switches 40, 42 are transistors of a PMOS type, controlled by a control signal EnableSA. As is known, the first inverter 26 is formed by a PMOS transistor 26' and an NMOS transistor 26"; likewise, the second inverter 32 is formed by a PMOS transistor 32' and an NMOS transistor 32". In particular, the control switch 40 of the first inverter 26 has a first conduction terminal connected to the supply voltage $V_{DD}$, and a second conduction terminal connected to the PMOS transistor 26'. Further, the control switch 42 of the second inverter 32 has a first conduction terminal connected to the supply voltage $V_{DD}$, and a second conduction terminal connected to the PMOS transistor 32'.

The reading stage 7 further comprises further switches 44, 45 provided via transistors an NMOS type controlled by the signal EnableSA and arranged between the ground plane GND and the first and second input nodes 6a, 6b, respectively, of the sense amplifier 6. In use of the memory device 1, the switches 44, 45 enable initialization, at start of a reading cycle, of the potential of the first and second inputs 6a, 6b of the sense amplifier 6 at the value of the potential of the ground plane GND. In this way, and as described in greater detail in the ensuing description of the reading method, at start of each reading cycle the coupling capacitors 22a, 22b are biased at a voltage corresponding to the potential of the charging line 19, whereas the compensation capacitors 30, 36 are biased at 0 V. In fact, according to an aspect of the present disclosure, the equilibrium switches 28, 34 are closed during the idle state of the sense amplifier 6, thus enabling complete discharge of the compensation capacitors 30, 36 and consequently preventing the risk of obtaining different behaviors by the sense amplifier 6 according to the history of the previous reading cycles.

The output terminal 26b of the first inverter 26 and the output terminal 32b of the second inverter 32 are connected to respective input terminals of a voltage comparator 50 of a known type, which is designed to compare the voltage at the output terminals 26b, 32b of the first and second inverters 26, 32 and generate an output signal DataSense. For example, the output signal DataSense has the logic value "0" if the voltage of the output terminal 26b of the first inverter 26 is lower than the voltage of the output terminal 32b of the second inverter 32; otherwise, it has the logic value "1".

FIGS. 3A-3H show the timing charts of respective control signals of respective switches of the memory device 1, using a common time scale. The control signals of FIGS. 3A-3H are generated by a controller 131, shown in FIG. 4, for example provided with a microprocessor, a DSP, or a microcontroller.

As has been said, the logic voltage-clamp signal YMPS_CLAMP, shown in FIG. 3A, controls the voltage-clamp switches 20a, 20b. In particular, when the logic voltage-clamp signal YMPS_CLAMP has the logic value "0", the voltage-clamp switches 20a, 20b are closed.

As has been said, the local-column-decoding signals $YO_L<j>$, $YO_R<j>$, shown in FIG. 3B, control the local-selection switches 13a, 13b. In particular, when the local-column-decoding signals $YO_L<j>$, $YO_R<j>$ have the logic value "0", the local-selection switches 13a, 13b are closed.

As has been said, the main-column-decoding signals $YN_L<i>$, $YN_R<i>$, shown in FIG. 3C, control the main-selection switches 12a, 12b. In particular, when the main-column-decoding signals $YN_L<i>$, $YN_R<i>$ have the logic value "0", the main-selection switches 12a, 12b are closed.

The precharging switches 14a, 14b are controlled, respectively, by a logic signal $/YN_L<i>$ and a logic signal $/YN_R<i>$, negated with respect to the main-column-decoding signals $YN_L<i>$, $YN_R<i>$. In particular, when the logic signals $/YN_L<i>$, $/YN_R<i>$ have the logic value "0", the precharging switches 14a, 14b are closed.

Word-line signals $S_{WL}$, supplied to the wordline WL and shown in FIG. 3D, control the selectors 3b of each memory cell 3, 3'. In particular, when the word-line signals $S_{WL}$ have the logic value "0", the selectors 3b are on.

FIG. 3E shows the timing chart of the signal EnableSA, which controls the switches 40, 42, 44, 45 as described previously with reference to FIG. 2.

The equilibrium switches 28, 34 are controlled by an equilibrium signal EQ, shown in FIG. 3F. In particular, when the equilibrium signal EQ has the logic value "1", the equilibrium switches 28, 34 are closed; otherwise, the equilibrium switches 28, 34 are open.

The first and second coupling switches 24a, 24b are controlled by a coupling signal HIZ, shown in FIG. 3G. In particular, when the coupling signal has the logic value "0", the first and second coupling switches 24a, 24b are closed; otherwise, the first and second coupling switches 24a, 24b are open.

The reading switch 38 is controlled by a reading signal NHIZ, shown in FIG. 3H. In particular, when the reading signal NHIZ has the logic value "0", the reading switch 38 is closed; otherwise, the reading switch 38 is open.

With joint reference to FIGS. 3A-3H, described hereinafter is a method for differential-reading of the logic data stored in a pair of memory cells 3, 3' associated to one another.

In a first step of the method, the control signals of the memory device 1 are in an initial configuration. In detail, at an initial instant t0, the signal YMPS_CLAMP has the logic value "0", the local-column-decoding signals $YO_L$<j>, $YO_R$<j> have the logic value "1", the main-column-decoding signals $YN_L$<i>, $YN_R$<i> have the logic value "1", the word-line signal $S_{WL}$ has the logic value "1", the signal EnableSA has the logic value "0", the equilibrium signal EQ has the logic value "1", the coupling signal HIZ has the logic value "0", and the reading signal NHIZ has the logic value "1".

In the initial configuration, the main-bitline capacitors 9, 9' are charged (as likewise all the main bitlines of the memory device 1) at the voltage value of the charging line 19 (/$YN_L$<i>="0" and /$YN_R$<i>="0"), for example supplied by a charge pump. Further, the coupling capacitors 22a, 22b are connected to the first and second inputs 7a, 7b, respectively, of the reading stage 7 via the first and second coupling switches 24a, 24b. Consequently, also the coupling capacitors 22a, 22b are charged at the voltage value of the charging line 19. At the same time, the local wordlines WL are biased at a voltage value such that the selectors 3b are in an off state, for example, a value of from 1.5 V to 1.8V; this voltage value may be supplied to the local wordlines WL by a charge pump (not shown).

The differential-reading operation starts at an instant t1 subsequent to the initial instant t0. At the instant t1, the local-column-decoding signals $YO_L$<j>, $YO_R$<j> and the main-column-decoding signals $YN_L$<i>, $YN_R$<i> change logic state, passing from the logic value "1" to the logic value "0", while the signal EnableSA passes from the logic value "0" to the logic value "1". The other control signals remain in the previous logic state (assumed at the instant t0).

Consequently, at the instant t1, the sense amplifier 6 is activated (EnableSA="1"), and the equilibrium switches 28, 34 are closed (EQ="1"). In the absence of the first and second compensation capacitors 30, 36, the first inverter 26 would set a potential on the second input 6b of the reading stage 6 equal to its own trip point, in general close to half of the supply voltage $V_{DD}$, plus an offset voltage, whereas the second inverter 32 would set a potential on the first input 6a of the reading stage 6 equal to its own trip point plus an offset voltage generally different from the offset voltage set on the second input 6b of the reading stage 6 on account of technological-process spreads that induce a mismatch between the inverters 26, 32. According to an aspect of the present disclosure, the presence of the first and second compensation capacitors 30, 36 enables storage of the two offset voltages so that at the moment when, in a subsequent step of the reading method, the equilibrium switches 28, 34 are re-opened, the inverters 26, 32 will still be in their amplification region and arranged electrically in series. The resulting latch structure will thus be in a state of metastable equilibrium and will remain in this state until an event such as to perturb this state occurs. In the absence of the compensation capacitors 30, 36, the mismatch between the inverters 26, 32 would have induced an unforeseeable switching of the latch structure upon opening of the equilibrium switches 28, 34.

Further, at the instant t1, a local bitline $BL_L$<j> and the corresponding local bitline $BL_R$<j> are connected to the respective main bitlines $MBL_L$, $MBL_R$ ($YO_L$<j>="0", $YO_R$<j>="0", $YN_L$<i>="0", $YN_R$<i>="0"), which are disconnected from the charging line 19 (/$YN_L$<i>="1", /$YN_R$<i>="1") by the respective precharging switches 14a, 14b, but remain supplied by the charging line 19 by the respective voltage-clamp switches 20a, 20b (YMPS_CLAMP="0"). Consequently, the bit-line capacitors 3c are charged at the same voltage as main-bitline capacitors 9, 9', i.e., at the voltage of the charging line 19. The value of the sum of all the capacitances $C_{MBL}$ of the main-bitline capacitors 9, 9' present in the memory array 2 and their initial condition (precharge at the value of the charging line 19) is such that the charging time of the bit-line capacitors 3c is dominated by the switching time of the local-selection switches 13a, 13b (thus being in the region of 1 ns). It should be noted that in this step of the differential-reading method there is no static power consumption that would be caused by passage of current in the memory cells 3, 3'.

Following upon charging of the local bitlines $BL_L$<j>, $BL_R$<j>, at an instant t2 subsequent to the instant t1, a subsequent step of the reading method is carried out. The time interval between the instant t1 and the instant t2 is fixed by an analog delay linked to charging of the local bitlines and is in the region of 1 ns. At the instant t2, the voltage-clamp signal YMPS_CLAMP presents a change of logic state, passing from the logic value "0" to the logic value "1". Consequently, the voltage-clamp switches 20a, 20b are opened, enabling a possible variation of the voltage at the first and second inputs 7a, 7b of the reading stage 7 subsequent to the instant t2 (at the instant t2, in fact, the voltage on the first and second inputs 7a, 7b of the reading stage 7 remains unvaried), as described hereinafter.

Next, at an instant t3 subsequent to the instant t2, a subsequent step of the reading method is carried out. At the instant t3, the word-line signal $SW_L$ presents a change of logic state, passing from the logic value "1" to the logic value "0". Consequently, the selectors 3b are in an on state, thus enabling passage of current. According to an aspect of the present disclosure, the time interval between the instant t2 and the instant t3 is selected so that the voltage-clamp signal YMPS_CLAMP switches before the word-line signal $SW_L$; for example, the time interval is shorter than 1 ns. Consequently, upon switching-on of the selectors 3b, the memory cells 3, 3' are disconnected from the charging line 19, preventing d.c. current consumption by the charge pump connected to the charging line 19, and thus reduction of the power consumption of the memory device 1. At the instant t3, the bit-line capacitors 3c and the main-bitline capacitors 9, 9' start to discharge via a passage of current through the respective memory cell 3, 3'. The respective values of the currents passing through the memory cells 3, 3' depend upon the state of the respective phase-change element 3a; in particular, if the phase-change element 3a is in a RESET state, the current through the memory cell is comprised, for example, between less than 100 nA and 5 µA; if the phase-change element 3a is in a SET state, the current through the memory cell is comprised, for example, between 10 µA and 30 µA. Consequently, the capacitors 3c, 9 of the left-hand side and the capacitors 3c, 9' of the right-hand side of the memory cell 2 discharge at different rates, causing the voltages at the inputs 7a, 7b of the reading stage 7 (which are equivalent to the voltages of the respective common nodes 25a, 25b) to be different during the discharge process.

At an instant t4, subsequent to the instant t3 by a time interval Δt for example comprised between 4 ns and 6 ns, a voltage difference ΔV between the inputs 7a, 7b of the reading stage 7 is obtained, and consequently a different voltage at the common nodes 25a, 25b, i.e., at the terminals of the coupling capacitors 22a, 22b connected to respective terminals of the coupling switches 24a, 24b. The voltage difference ΔV is, for example, higher than 30 mV when the difference between the currents passing through the memory cells 3, 3' is on average 2 μA during the time interval Δt. At the instant t4, the bit-line capacitors 3c and the main-bitline capacitors 9, 9' are only partially discharged. At the instant t4, the first and second coupling switches 24a, 24b are opened. Consequently, the common nodes 25a, 25b of the reading stage 7 are disconnected from the respective inputs 7a, 7b of the reading stage 7, and the respective voltage of the common nodes 25a, 25b does not vary any further (i.e., it is "frozen" at the last voltage value assumed during the time interval Δt). Further, the voltage discharge of the bit-line capacitors 3c and of the main-bitline capacitors 9, 9' tends to an asymptote corresponding to the threshold voltage of the respective selector 3b.

At an instant t5 subsequent to the instant t4, a sensing step is carried out, in which the first and second equilibrium switches 28, 34 are opened, and the reading switch 38 is closed.

As described in detail previously, opening of the equilibrium switches 28, 34 causes the sense amplifier 6 to be in a condition of metastable equilibrium; further, closing of the reading switch 38 (at time t5 or subsequently) sets in series the coupling capacitors 22a, 22b so as to eliminate the common-mode voltage between the coupling capacitors 22a, 22b themselves (which is due to precharging of the main-bitline capacitors 9, 9'). In this way, only the differential voltage between the coupling capacitors 22a, 22b is sent to the inputs 6a, 6b of the sense amplifier 6 (in addition to the compensation of the offset between the inverters 26, 32).

Consequently, even though the step of precharging of the main-bitline capacitors 9, 9' has occurred at high voltages (up to values, for example, comprised between 1.5 V and 1.8 V), use of the coupling capacitors 22a, 22b enables proper operation of the sense amplifier 6 when it is supplied at much lower voltages (for example, lower than 1 V) and thus limitation of power consumption of the memory device 1.

The potential difference present across the two coupling capacitors 22a, 22b, due to the previous difference between the discharge currents of the memory cells 3, 3', perturbs the condition of metastable equilibrium of the sense amplifier 6e and induces a switching thereof according to the sign of the aforesaid difference of potential, such that the output terminals 26b, 32b of the inverters 26, 32 will assume complementary logic values. In other words, the output terminals 26b, 32b of the inverters 26, 32 assume complementary logic values as a function of the state of the respective phase-change element 3a, enabling a differential-reading of the logic data stored in the cells 3, 3'. For example, the logic values corresponding to the voltage on the output terminals 26b, 32b of the inverters 26, 32 follow the rules listed in the table below.

| Memory cell 3 | Memory cell 3' | Output terminal 26b | Output terminal 32b |
|---|---|---|---|
| SET | RESET | "0" | "1" |
| RESET | SET | "1" | "0" |

Once a good separation of the voltage of the output terminals 26b, 32b of the inverters 26, 32 has been achieved, for example greater than 100 mV, it is possible to enable the comparator 50 so as to update the value of the output signal DataSense as a function of the logic data stored in the memory cells 3, 3'. In the case where the voltage difference between the output terminals 26b, 32b of the inverters 26, 32 is greater than 100 mV, the voltage comparator 50 may be provided with transistors of minimal size, at the same time optimizing the occupation of area and the reading rate.

Next, it is possible to bring the control signals back into the initial condition of the instant t0 previously described, thus completing a reading cycle. In particular, upon passage to the logic state "1" of the word-line signal $SW_L$, discharge of the bit-line capacitors 3c and of the main-bitline capacitors 9, 9' is interrupted. Consequently, less current is consumed at the moment when the main bitline is recharged in the precharging step of the next reading cycle.

Figure 4:
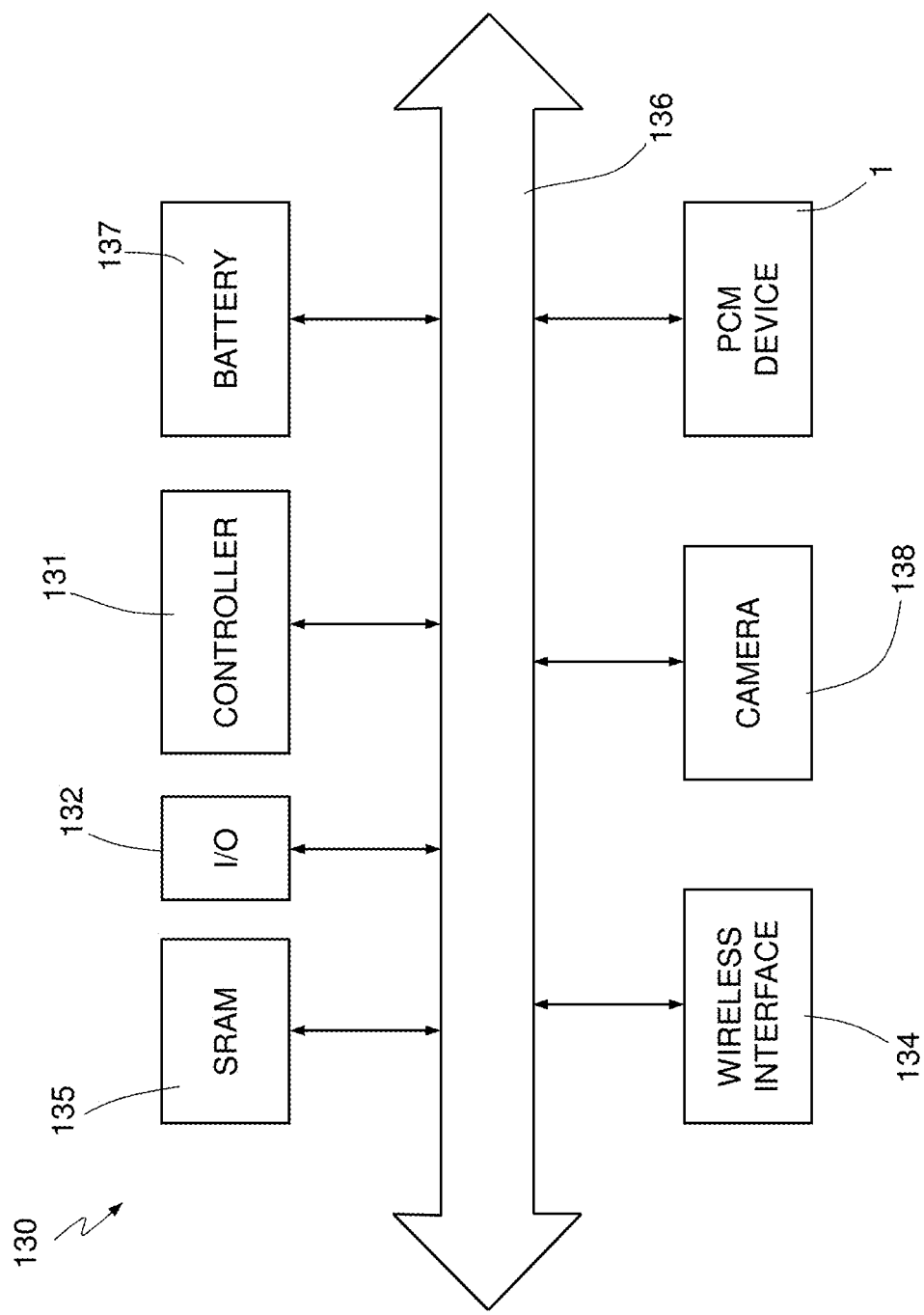
FIG. 4 is a simplified block diagram of an electronic system incorporating the nonvolatile memory device, in one embodiment of the present invention.

FIG. 4 shows a portion of an electronic system 130 according to a further embodiment of the present invention. The electronic system 130 may be used in electronic devices, such as: a PDA (Personal Digital Assistant); a portable or fixed computer, possibly with capacity of wireless data transfer; a cell phone; a digital audio player; a photographic or video camera; or further devices that are able to process, store, transmit, and receive information.

In detail, the electronic system 130 comprises the nonvolatile memory device 1, provided with the array of memory cells of the phase-change type, previously described, and the controller 131 (for example, provided with a microprocessor, a DSP, or a microcontroller), both coupled to a bus 136 designed to route the control signals of FIGS. 3A-3H towards the nonvolatile memory device 1. In addition, the electronic system 130 may optionally comprise, coupled to the bus 136, one or more of the following: an input/output device 132 (for example, provided with a keypad and a display), for input and display of data; a wireless interface 134, for example an antenna, for transmitting and receiving data through a radio-frequency wireless-communication network; a RAM 135; a battery 137, which may be used as electric supply source in the electronic system 130; and a photographic camera and/or a video camera 138.

According to a different embodiment, the controller 131 is coupled to the nonvolatile memory device 1 by a dedicated connection different from, and possibly additional to, the bus 136 (the latter may thus be present or absent).

From an examination of the characteristics of the invention described and illustrated herein, the advantages that it affords are evident.

For example, the architecture of the reading stage 7 differs from the prior art for the presence of the coupling capacitors 22a, 22b, and for the method with which these are connected during the precharging and sensing step, that enable supply of the sense amplifier 6 with a supply voltage $V_{DD}$ lower than the biasing voltage of the local wordlines WL and of the local bitlines $BL_L$, $BL_R$. In particular, it is possible to supply the sense amplifier 6 without using charge pumps, thus considerably reducing the power consumption of the memory device 1. Further, the reduction of the supply voltage as compared to the known art enables miniaturization of the sense amplifier 6, which may be obtained via transistors that have a thinner gate oxide.

In addition, the fact that all the main-bitline capacitors 9, 9' of the entire memory device 1 are precharged at the start of a reading cycle makes it possible to simplify the circuitry that drives the charging line 19, in so far as it is possible to reduce the output capacitance and the capacity of the circuitry to supply peak current. Furthermore, the simultaneous presence of an offset-zeroing method enables reduction of the duration of the reading cycle and increase of the sensitivity of the circuit even in the presence of minor currents differences. The possibility of reducing the duration of the reading cycle enables decrease in the consumption of energy spent in recharging the main-bitline capacitors 9, 9'. Finally, the size of the transistors used in the sense amplifier 6 may be minimized, enabling a higher switching rate and a smaller occupation of area.

Finally, it is clear that modifications and variations may be made to the disclosure described and illustrated herein, without thereby departing from the scope of the present invention, as defined in the annexed claims.

For example, the phase-change element 3a may be replaced by a generic element with variable resistance obtained with any technology (not necessarily phase-change technology).

Further, the control signals that are subject to a change of logic state at the instant t1 of closing of the local-selection switches 13a, 13b may alternatively change logic state at instants subsequent to the instant t1 but prior to the instant t2. In addition, the reading switch 38 may be closed subsequent to the instant t5 of opening of the equilibrium switches 28, 34. Finally, it should be emphasized that the reading method described in the present disclosure may advantageously be used also for memory devices based upon nonvolatile memory elements in which a cell selector with very high threshold is present. Such a cell selector may, for example, be a transistor of a BJT type, a diode or any other switching element with high threshold voltage (beyond 0.5 V).

What is claimed is:

1. A phase-change memory device comprising:
   a memory array comprising:
      a first local bitline coupled to a first memory cell that comprises a first BJT transistor having a current path coupled in series with a first phase-change element, the first phase-change element having a first value of resistance associated with a first logic datum, wherein the first local bitline has a first parasitic capacitance,
      a second local bitline coupled to a second memory cell that comprises a second BJT transistor having a current path coupled in series with a second phase-change element, the second phase-change element having a second value of resistance associated with a second logic datum, wherein the second value of resistance is different from the first value of resistance, and wherein the second local bitline has a second parasitic capacitance,
      a first main bitline having a third parasitic capacitance, and
      a second main bitline having a fourth parasitic capacitance;
   a supply line configured to supply a first supply voltage;
   a first precharging switch coupled between the first main bitline and the supply line;
   a second precharging switch coupled between the second main bitline and the supply line;
   a first local switch coupled between the first local bitline and the first main bitline;
   a second local switch coupled between the second local bitline and the second main bitline; and
   a controller operatively coupled to respective control terminals of the first and second precharging switches and of the first and second local switches, the controller configured to:
      at a first instant, close the first and second precharging switches for charging the third and fourth parasitic capacitances at the first supply voltage,
      at a second instant temporally subsequent to the first instant, open the first and second precharging switches and close the first and second local switches, for charging the first and second parasitic capacitances using the third and fourth parasitic capacitances, and
      at a third instant temporally subsequent to the second instant, activate the first BJT transistor to discharge the first and third parasitic capacitances through the first memory cell at a first discharge rate that is a function of the first value of resistance, and activate the second BJT transistor to discharge the second and fourth parasitic capacitances through the second memory cell at a second discharge rate that is a function of the second value of resistance.

2. The phase-change memory device of claim 1, further comprising a reading stage coupled to the memory array and configured to read a logic datum contained in the first and second memory cells by comparing the first and second discharge rates.

3. The phase-change memory device of claim 2, wherein the reading stage comprises:
   a first input terminal coupled to the first local switch;
   a second input terminal coupled to the second local switch; and
   a sense amplifier comprising:
      a first input terminal coupled to the first input terminal of the reading stage,
      a second input terminal coupled to the second input terminal of the reading stage,
      a first inverter having an input coupled to the first input terminal of the sense amplifier, and an output coupled to the second input terminal of the sense amplifier, and
      a second inverter having an input coupled to the second input terminal of the sense amplifier and an output coupled to the first input terminal of the sense amplifier.

4. The phase-change memory device of claim 3, further comprising a comparator having a first input coupled to the output of the first inverter and a second input coupled to the output of the second inverter.

5. The phase-change memory device of claim 3, wherein the sense amplifier further comprises:
   a first compensation capacitor coupled between the output of the second inverter and the input of the first inverter; and
   a second compensation capacitor coupled between the output of the first inverter and the input of the second inverter.

6. The phase-change memory device of claim 3, wherein the reading stage comprises:
   a first coupling switch coupled between the first input terminal of the reading stage and the first local switch; and
   a second coupling switch coupled between the second input terminal of the reading stage and the second local switch.

7. The phase-change memory device of claim 3, wherein the sense amplifier further comprises a first equilibrium switch coupled between the input of the first inverter and the output of the first inverter.

8. The phase-change memory device of claim 3, wherein the first inverter comprises a first PMOS transistor and a first NMOS transistor, wherein the second inverter comprises a second PMOS transistor and a second NMOS transistor, and wherein the sense amplifier further comprises a first control switch coupled in series with the first PMOS transistor, and a second control switch coupled in series with the second PMOS transistor.

9. The phase-change memory device of claim 8, wherein the controller is further configured to close the first and second control switches at the second instant.

10. The phase-change memory device of claim 1, wherein the first phase-change element comprises chalcogenide, and wherein the second phase-change element comprises chalcogenide.

11. The phase-change memory device of claim 1, wherein the third parasitic capacitance is between 30 fF and 120 fF, and wherein the fourth parasitic capacitance is between 30 fF and 120 fF.

12. A method comprising:
   at a first instant, closing a first precharging switch of a phase-change memory device to charge a parasitic capacitance of a first main bitline of a memory array of the phase-change memory device, the first precharging switch being coupled between the first main bitline and a supply line of the phase-change memory device;
   at a second instant, closing a second precharging switch of the phase-change memory device to charge a parasitic capacitance of a second main bitline of the memory array, the second precharging switch being coupled between the second main bitline and the supply line;
   at a third instant temporally subsequent to the first instant, opening the first precharging switch and closing a first local switch of the phase-change memory device to charge a parasitic capacitance of a first local bitline of the memory array, the first local bitline being coupled to a first memory cell that comprises a first BJT transistor having a current path coupled in series with a first phase-change element, wherein the first phase-change element has a first value of resistance associated with a first logic datum, and wherein the first local switch is coupled between the first local bitline and the first main bitline;
   at a fourth instant temporally subsequent to the second instant, opening the second precharging switch and closing a second local switch of the phase-change memory device to charge a parasitic capacitance of a second local bitline of the memory array, the second local bitline being coupled to a second memory cell that comprises a second BJT transistor having a current path coupled in series with a second phase-change element, wherein the second phase-change element having a second value of resistance associated with a second logic datum, wherein the second value of resistance is different from the first value of resistance, and wherein the second local switch is coupled between the second local bitline and the second main bitline;
   at a fifth instant temporally subsequent to the third instant, activating the first BJT transistor to discharge the parasitic capacitances of the first local bitline and of the first main bitline through the first memory cell at a first discharge rate that is a function of the first value of resistance; and
   at a sixth instant temporally subsequent to the fourth instant, activating the second BJT transistor to discharge the parasitic capacitances of the second local bitline and of the second main bitline through the second memory cell at a second discharge rate that is a function of the second value of resistance.

13. The method of claim 12, wherein the first instant and the second instant are the same instant, wherein the third instant and the fourth instant are the same instant, and wherein the fifth instant and the sixth instant are the same instant.

14. The method of claim 12, wherein the third instant and the fourth instant are the same instant, the method further comprising, at the third instant,
   closing a first control switch that is coupled in series with a first transistor of a first inverter of a sense amplifier of a reading stage of the phase-change memory device, the first inverter having an input coupled to the first local switch and an output coupled to the second local switch; and
   closing a second control switch that is coupled in series with a second transistor of a second inverter of the sense amplifier, the second inverter having an input coupled to the output of the first inverter, and an output coupled to the input of the first inverter.

15. The method of claim 14, further comprising, at an instant between the first instant and the third instant,
   closing a first coupling switch that is coupled between the input of the first inverter and the first local switch; and
   closing a second coupling switch that is coupled between the output of the first inverter and the second local switch.

16. The method of claim 15, further comprising, at an instant between the third instant and the third instant, opening the first and second coupling switches.

17. The method of claim 12, wherein the parasitic capacitance of the first main bitline is between 30 fF and 120 fF, and wherein the parasitic capacitance of the second main bitline is between 30 fF and 120 fF.

18. A memory device comprising:
   a memory array comprising:
      a first local bitline coupled to a first memory cell that comprises a first BJT transistor having a current path coupled in series with a first element, the first element having a first value of resistance associated with a first logic datum, wherein the first local bitline has a first parasitic capacitance,
      a second local bitline coupled to a second memory cell that comprises a second BJT transistor having a current path coupled in series with a second element, the second element having a second value of resistance associated with a second logic datum, wherein the second value of resistance is different from the first value of resistance, and wherein the second local bitline has a second parasitic capacitance,
      a first main bitline having a third parasitic capacitance, and
      a second main bitline having a fourth parasitic capacitance;
   a supply line configured to supply a first supply voltage;
   a first precharging switch coupled between the first main bitline and the supply line;
   a second precharging switch coupled between the second main bitline and the supply line;
   a first local switch coupled between the first local bitline and the first main bitline;
   a second local switch coupled between the second local bitline and the second main bitline; and
   a controller operatively coupled to respective control terminals of the first and second precharging switches and of the first and second local switches, the controller configured to:
      at a first instant, close the first and second precharging switches for charging the third and fourth parasitic capacitances at the first supply voltage, at a second instant temporally subsequent to the first instant, open the first and second precharging switches and close the first and second local switches, for charging the first and second parasitic capacitances using the third and fourth parasitic capacitances, and at a third instant temporally subsequent to the second instant, activate the first BJT transistor to discharge the first and third parasitic capacitances through the first memory cell at a first discharge rate that is a function of the first value of resistance, and activate the second BJT transistor to discharge the second and fourth parasitic capacitances through the second memory cell at a second discharge rate that is a function of the second value of resistance; and a reading stage coupled to the memory array and configured to read a logic datum contained in the first and second memory cells by comparing the first and second discharge rates.

19. The memory device of claim 18, wherein the memory device is a phase-change memory device, wherein the first element is a first phase-change element, and wherein the second element is a second phase-change element.

20. The memory device of claim 18, wherein the reading stage comprises:

a first input terminal coupled to the first local switch;

a second input terminal coupled to the second local switch; and a sense amplifier comprising:

a first input terminal coupled to the first input terminal of the reading stage, a second input terminal coupled to the second input terminal of the reading stage, a first inverter having an input coupled to the first input terminal of the sense amplifier, and an output coupled to the second input terminal of the sense amplifier, and a second inverter having an input coupled to the second input terminal of the sense amplifier and an output coupled to the first input terminal of the sense amplifier.

\* \* \* \* \*